United States Patent [19]
Ishida

[11] Patent Number: 5,991,212
[45] Date of Patent: Nov. 23, 1999

[54] SEMI-CONDUCTOR INTEGRATED CIRCUIT DEVICE HAVING AN EXTERNAL MEMORY AND A TEST METHOD THEREFOR

[75] Inventor: Ryuji Ishida, Tokyo, Japan

[73] Assignee: NEC Coporation, Tokyo, Japan

[21] Appl. No.: 08/889,100

[22] Filed: Jul. 7, 1997

[30] Foreign Application Priority Data

Jul. 4, 1996 [JP] Japan ................................ 8-174500

[51] Int. Cl.⁶ .................................................. G11C 7/00
[52] U.S. Cl. ...................................... 365/201; 365/230.06
[58] Field of Search ............................... 365/201, 230.06

[56] References Cited

U.S. PATENT DOCUMENTS

| | | | |
|---|---|---|---|
| 4,860,260 | 8/1989 | Saito et al. | 365/201 |
| 4,975,641 | 12/1990 | Tanaka et al. | 324/158 |
| 5,519,657 | 5/1996 | Arimoto | 365/201 |

FOREIGN PATENT DOCUMENTS 1-239485  9/1989  Japan .

*Primary Examiner*—David Nelms
*Assistant Examiner*—M. Tran
*Attorney, Agent, or Firm*—Sughrue, Mion, Zinn, Macpeak & Seas, PLLC

[57] ABSTRACT

In a semi-conductor integrated circuit device, a memory space provided with the integrated circuit device is not occupied by space for testing the integrated circuit device as the testing memory space. In the test mode of the semi-conductor integrated circuit device, test of internal circuit is capable of being implemented due to the fact that it permits a part of region belonging to the integrated circuit device to allocate to outer memory space. While in a normal operation mode, degree of freedom of design of the integrated circuit device is increased by releasing the testing memory space.

12 Claims, 3 Drawing Sheets

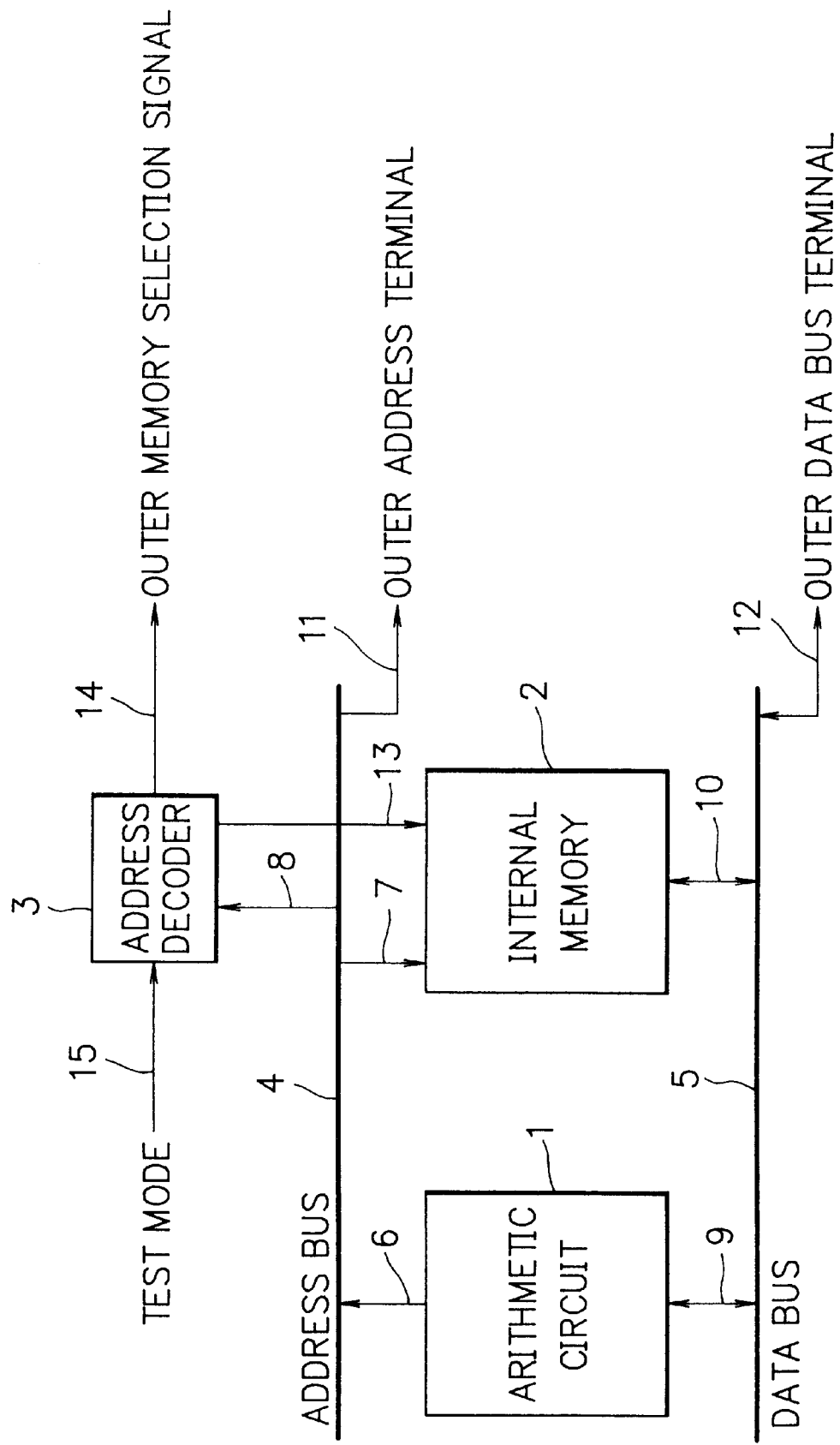

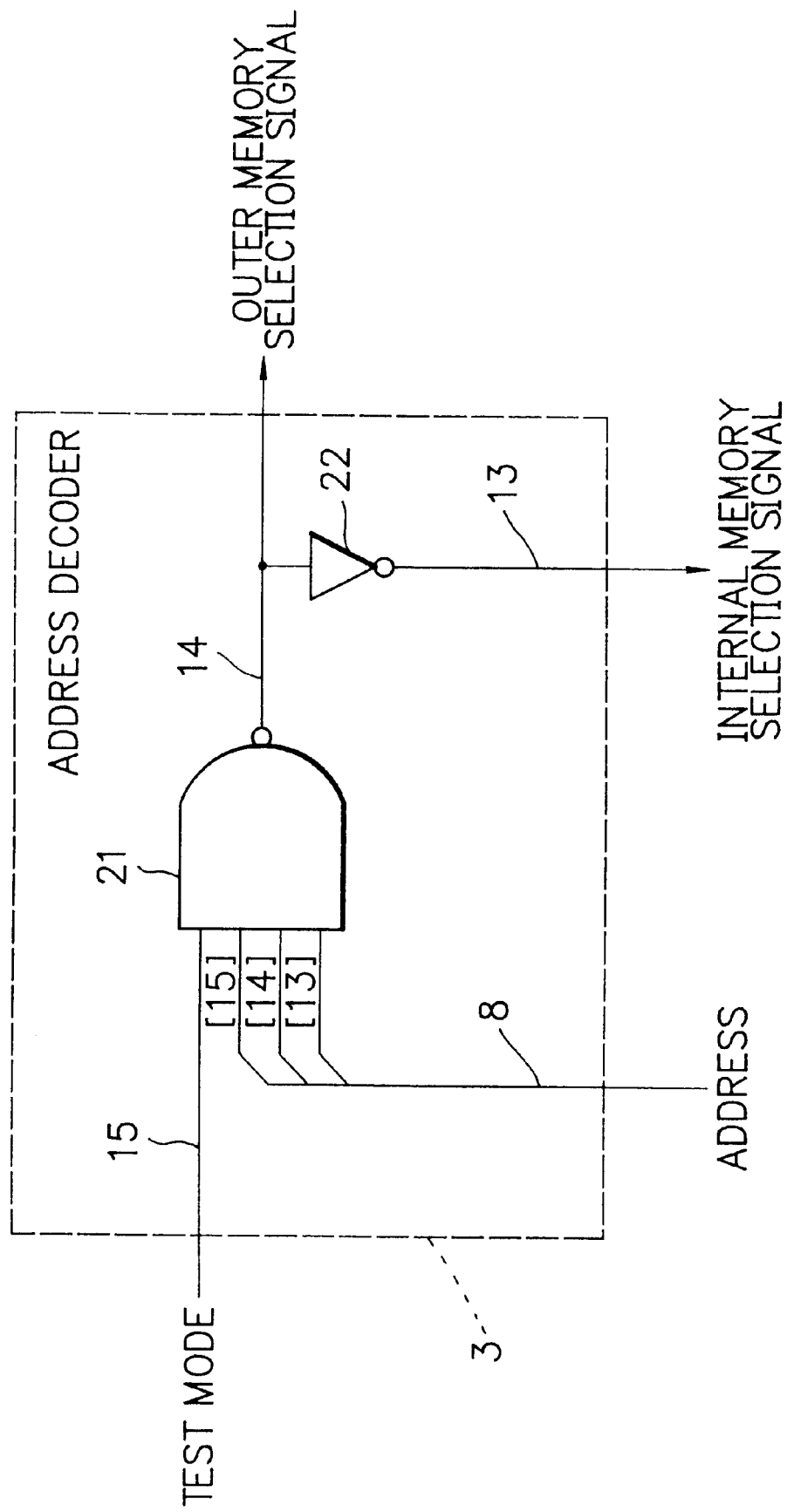

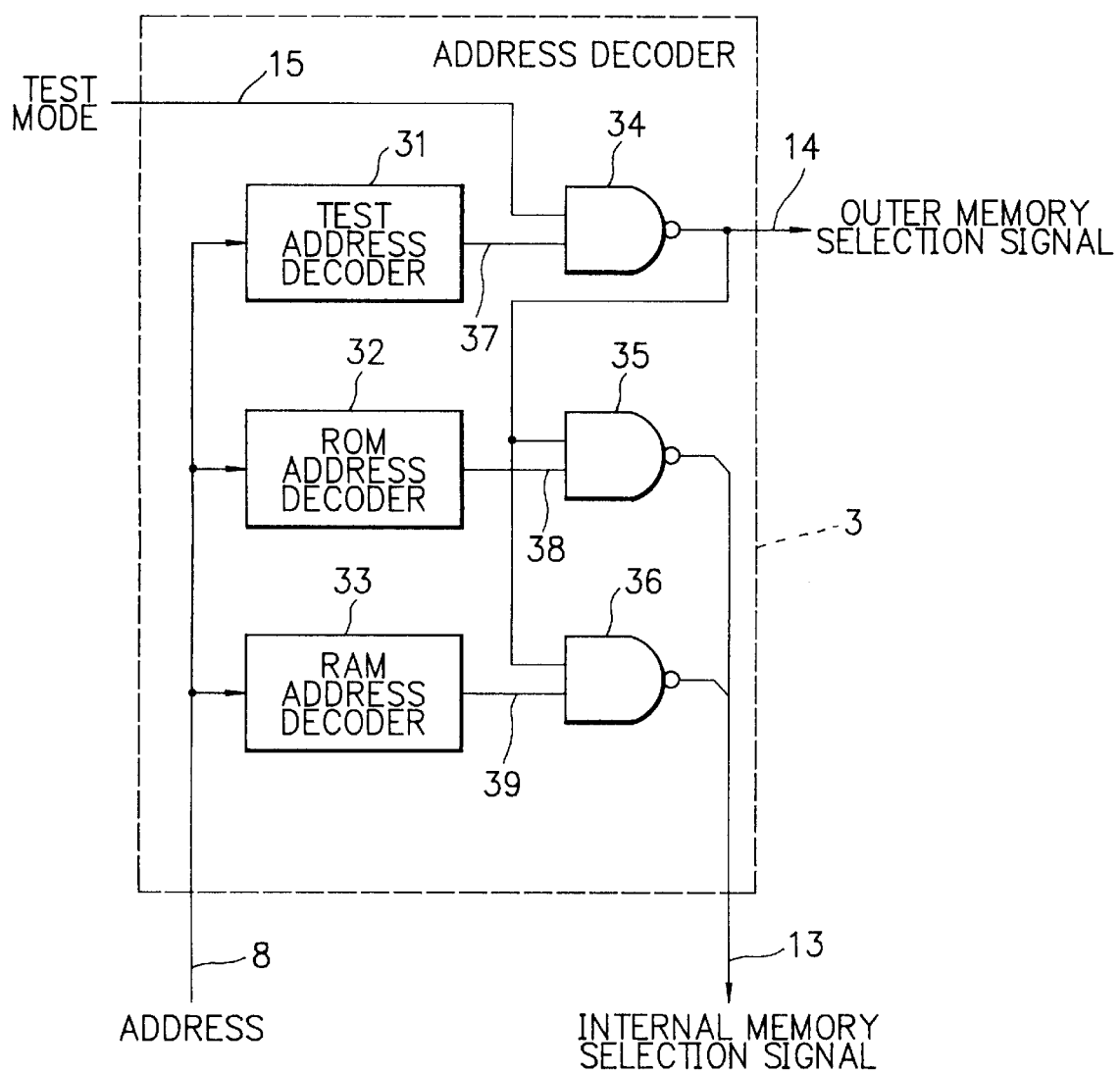

SEMI-CONDUCTOR INTEGRATED CIRCUIT DEVICE HAVING AN EXTERNAL MEMORY AND A TEST METHOD THEREFOR

BACKGROUND OF THE INVENTION

The present invention relates to a semi-conductor integrated circuit device. More particularly, this invention relates to a test circuit of a semi-conductor integrated circuit device.

DESCRIPTION OF THE PRIOR ART

Formerly, in the test circuit of the semi-conductor integrated circuit device, in order to implement a performance test of an internal circuit, a part of an internal memory region is reserved as a test memory region. Test instruction code, test data, and so forth are written in terms of this test memory region beforehand. The region within which test instruction code and test data are written is accessed in the test mode, thus implementing the test of the internal circuit. However, under this test method, it is necessary to ascertain a test instruction code and a test data of the internal circuit. Furthermore, there is the problem that when an error occurs, analytical property is very low.

In order to cope with such problems, one test method is disclosed in the Japanese Patent Application Laid-Open No. HEI 1-239485. In this test method, a memory region for a test is constituted by a RAM. The test instruction code and the test data are down loaded from an external section, before performing the test. However, in general, an area of a RAM is larger than that of a ROM. Furthermore, since it is necessary to provide a redundant circuit such as a writing circuit thereto from the outer section, a larger chip area is required.

As another method, a terminal for memory-access is provided as an outer terminal, thus taking a test instruction code and test data therein from an outer-chip.

However in these prior art devices, while they permit a memory region for the test to be allocated to internal memory, there is the defect that enlargement of hardware scale is required.

When part of the memory space is occupied as the test region, there is the defect that effective practical use of the whole memory region is disturbed accordingly. Particularly, in recent years, various cores of the processor are required. Design of an ACIC system using macro blocks becomes realistic. Under this state, the degree of freedom of design of a system is disturbed remarkably, because a part of memory space for a test is incapable of being utilized beforehand.

SUMMARY OF THE INVENTION

In view of the foregoing, it is an object of the present invention to provide a semi-conductor integrated circuit device provided with an improved test method.

It is another object of the present invention to provide a semi-conductor integrated circuit device which is capable of performing a test of the internal circuit with a minimal increase of hardware.

According to one aspect of the present invention, for achieving the above-mentioned object, there is provided a semi-conductor integrated circuit device using single-chip semi-conductor which comprises address decode means for decoding that space is test memory space, when a test mode instruction signal denotes a test mode, it causes a decode signal outputted from said address decode means to be effective, while when a test mode instruction signal denotes a non-test mode, it causes a decode signal outputted from said address decode means to be ineffective, when said decode signal is active, allocating memory region accessed by said semi-conductor integrated circuit device to a memory region external to said semi-conductor integrated circuit device.

When output of test region address decoder denotes a region, there are means for preventing access to normal memory region and allowing access to the outer memory region.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 1 is a block diagram showing a first embodiment according to the present invention;

FIG. 2 is a block diagram showing an address decoder of FIG. 1; and

FIG. 3 is a block diagram showing an address decoder of a second embodiment according to the present invention.

DETAILED DESCRIPTION OF THE PREFERRED EMBODIMENTS

A preferred embodiment of the invention will now be described in detail referring to the accompanying drawings.

FIG. 1 is a block diagram showing an internal circuit of an integrated circuit of a first embodiment according to the present invention. In the first embodiment, an internal-data-bus-width is taken as 16 bits, and an address-width is taken as 16 bits. In the test mode, 8 k words after 0xe000h are used as a test region. The capacity of the outer memory region, and the layout of memory space for the test mode may be set as required. It is not necessary to set these parameters to the values discussed in this embodiment.

The integrated circuit device of the first embodiment comprises an arithmetic circuit 1, an internal memory 2, an address bus 4, a data bus 5, and data lines 6, 7, 8, 9, 10, 11, 12, 13, 14 and 15. The arithmetic circuit 1 is a block within a single-chip microprocessor which block implements data arithmetic, thus outputting a 16 bit memory access address from the data line 6 to the address bus 4. The arithmetic circuit 1 input 16-bit data from bus 5 via the data line 9. The internal memory 2 is a memory with 16 bits of one-word-width included in the single-chip microprocessor. Operation of the internal memory 2 is activated by the value indicated by the data line 13. The internal memory 2 responds to address data on the address bus 4 inputted from the data line 7, thus implementing input-output of data on the data bus 5 via the data line 10. An address data inputted from the data line 8 on the address bus 4 is decoded by the address decoder 3 depending on a value which indicates test mode inputted from the data line 15, the address decoder 3 outputting selection signal of internal data memory region to the data line 13, and outputting outer memory selection signal to the data line 14. A data on the address bus 4 is outputted to the other address terminal for accessing the outer memory from the data line 11. A data on the data bus 5 is connected to the outer terminal of the data bus by the data line 12.

FIG. 2 is a gate circuit view showing one example of the address decoder 3. The address decoder 3 comprises 4-input NAND gate 21, and an inverter 22. The data line 15 which is the input line of a signal denoting test mode is connected to an input of the 4-input NAND gate 21. High-order 3 bits within the data line 8 to which address data is inputted are connected to the input of the 4-input NAND gate 21. Output of the 4-input NAND gate 21 is outputted as an outer memory selection signal from the data line 14. Output of the 4-input NAND gate 21 is connected to the input of the inverter 22. Output of the inverter 16 is outputted as an internal memory selection signal from the data line 13.

Next, operation of the integrated circuit device will be described. Firstly, a case of normal operation will be described. In case of normal operation the test mode signal is set to "0". On account of this setting, "0" is inputted to the 4-input NAND gate 21 from the data line 15, so that the data line 14 connected to the output-end becomes "1". Since the input-end of the inverter 22 becomes "1", the data line 13 connected to the output-end becomes "0". Chip selection signal of the normal memory is active in low level. Consequently, in this embodiment, when the memory selection signal is "0", it is considered that the memory becomes active, but it is not necessary that the signal be restrained in this manner. For example, when active a memory which is active in response to a "1" is used, it is proper to perform inversion-output of respective memory selection signals. In the embodiment, the outer memory is not selected in accordance with the value of the data line 14 so that the internal memory is selected. Under this state, when it permits the single-chip microprocessor to operate, input-output of data between the internal memory 2 and the single-chip microprocessor is capable of being implemented. At this time, the outer memory region does not function because the outer memory selection signal is in a non-selection state. Consequently, in the normal operation mode, the arithmetic circuit 1 is capable of accessing the internal memory 2 in all address space. Namely, it is not necessary to reserve a specific region of memory space for a test beforehand, thus allowing use of all the memory space.

Next, operation at the time of test mode will be described. At the time of test mode, test mode signal is set to "1". On account of this setting, "1" is inputted to the 4-input NAND gate 21 from the data line 15. When each of the 3 high-order bits of the data line 8 with 16-bit-width, (bit 15 to bit 13) are "1", namely, when 0xc000h to 0xffffh addresses are inputted, output of the 4-input NAND gate 21 becomes "0". Consequently, at this time, the outer memory selection signal becomes active, while the internal memory selection signal becomes inactive. Under this condition, in the arithmetic circuit 1 of the single-chip microprocessor, addresses of 0x0000h to 0xdfffh access the internal memory region, while addresses of 0xc000h to 0xffffh access the outer memory.

When the test of the processor is implemented, the test of the internal circuit is capable of being performed by inputting the instruction code, test data and so forth to the processor from the outer memory region. It is not necessary to write the test instruction code and the test data to the inside of the internal circuit, thus improving testability.

When only restricted region is used as the test memory region, the outer memory region is capable of being reduced. Namely, when 1 k word within the address space with 16-bit width is used as test region, it is sufficient that there are only ten address terminals for outputting to the outer memory so that the number of terminals necessary for the test can be reduced. Furthermore, in this test mode, a test of a peripheral circuit which is mapped into the area is capable of being performed because the access thereto can be implemented in the same way as the normal operation in terms of regions with the exception of the address region which is switched to the outer memory region.

In the above embodiment, an example with respect to only one memory space is shown. Due to the fact that respective memory space has the same circuit, it is capable of being applied to a test circuit of a microprocessor with a plurality of memory spaces. For example, in the microprocessor with Harvard architecture, an instruction memory region and a data memory region are separated into two memory spaces. Recently, a single-chip microprocessor with a lot of memory spaces such as digital signal processor (DSP) and so forth, is known. In these processors, it becomes possible to control an access to the outer memory space in every memory space independently. At this time, the number of outer terminals can be reduced by the method of pin-multiplexing and so forth.

Next, a second embodiment of the invention will be described in detail. Although a fundamental constitution of the second embodiment is the constitution which is similar to the first embodiment as shown in FIG. 1, an address decoder 3 is constituted as shown in FIG. 3.

The address decoder 3 comprises a test address decoder 31, a ROM address decoder 32, a RAM address decoder 33, 2-input NAND gates 34, 35, and 36, and data lines 8, 13, 14, 37, 38, and 39. The data line 8 is connected to input-ends of respective address decoders 31, 32, and 33. The data line 37 is connected to an output-end of the test address decoder 31. The data line 38 is connected to an output-end of the ROM address decoder 32. The data line 39 is connected to an output-end of the RAM address decoder 33. The data line 15 and the data line 37 are connected to an input-end of the 2-input NAND gate 34. The data line 14 is connected to an output-end of the 2-input NAND gate 34. The data line 14 and the data line 38 are connected to input-ends of the 2-input NAND gate 35. Bit [1] of the data line 13 is connected to an output-end of the 2-input NAND gate 35. The data line 14 and the data line 39 are connected to input-ends of the 2-input NAND gate 36. Bit [0] of the data line 13 is connected to an output-end of the 2-input NAND gate 36.

The internal memory 2 of the second embodiment is constituted by two blocks of the ROM and the RAM. The data line 13 is a 2-bit data line because the data line 13 has a selection signal of the ROM and the RAM respectively. Bit [1] is ROM selection signal, and bit [0] is RAM selection signal.

The test address decoder 31 decodes an address data inputted from the data line 8, thus outputting "1" when the test address decoder 31 denotes a test memory region, while when the test address decoder 31 does not denote the test memory region, "0" is outputted. The ROM address decoder 32 decodes an address data inputted from the data line 8, thus outputting "1" when the ROM address decoder 32 denotes a ROM memory region, while when the ROM address decoder 32 does not denote the ROM memory region, "0" is outputted. The RAM address decoder 33 decodes an address data inputted from the data line 8, thus outputting "1" when the RAM address decoder 33 denotes a RAM memory region, while when the RAM address decoder 33 does not denote the RAM memory region, "0" is outputted.

At the time of normal operation mode, "0" as the test mode signal is inputted from the data line 15. On account of the input, output of the 2-inupt NAND gate 34 becomes "1", while outer part memory selection signal becomes inactive.

Since the input of one side of respective 2-inupt NAND gates 35, 36 becomes "1", the 2-inupt NAND gate 35 inversion-outputs value of the data line 37, and the 2-inupt NAND gate 36 inversion-outputs a value of the data line 39. Consequently, when output of the ROM address decoder 32 becomes active, the ROM selection signal within the internal memory selection signal becomes active, and when the output of the RAM address decoder 33 becomes active, the RAM selection signal within the internal memory selection signal becomes active. In response to this state, when the address denotes the ROM region, input-output of data in relation to the internal ROM becomes possible, while when the address denotes the RAM region, input-output of data in relation to the internal RAM becomes possible. Consequently, in the time of normal operation mode, the single-chip microprocessor is capable of accessing the ROM or the RAM of the internal memory mapped to the voluntary address on the memory space in accordance with the address data outputted from the internal arithmetic circuit 1.

In the test mode, "1" as the test mode signal is inputted from the data line 15. At this point, when the value which is indicated by the address data inputted from the data line 8 denotes the region mapped into outer memory region for the test, output of the test address decoder 31 becomes "1", and output of the 2-inupt NAND gate 34 becomes "0". At this time, input of one side of respective 2-inupt NAND gate becomes "0", therefore, output of the 2-inupt NAND gates 35, 36 always become "1". On the assumption that the memory region of the ROM is established such that it includes the test memory region, with regard to the test memory region within the address of ROM in the test mode, access to the internal ROM is negated, while access to the outer memory region is implemented. Namely, it is not necessary to allocate the specific region within the memory space included into the arithmetic circuit as a test memory space beforehand.

In the second embodiment, it is shown that the internal memory region is divided into two regions of the ROM and the RAM. Also in the cases where the internal memory region is divided into a lot of regions, an enlargement thereof is capable of implementing the same method. Namely, when it permits generation of selection signals in terms of respective memory regions, the enlargement can be realized by masking one or more region selection signals which uses memory region corresponding to the test memory region by virtue of test memory region selection signal being active only during the test mode. It can be considered that one or more regions within the divided regions is also allocated to the outer part memory. In this case, logical adders of both of the test memory selection signal and the outer part memory selection signal in the normal mode as the practical outer memory are used. At this time, outer part address terminal for accessing outer part memory, outer part data bus terminal, outer part memory selection signal output terminal are capable of being shared.

When selection of the memory to be accessed is implemented, there is the method using read/write strobe signal in terms of respective memory regions. It is capable of coping with the method having read/write strobe signal by using respective memory region selection signals in the embodiment as the masking signal of these strobe signals.

Furthermore, when it permits external hardware memory resources to map to memory space, the test is capable of being performed by accessing these hardware resources from the arithmetic circuit by virtue of a mapping exception for the test memory region in the test mode.

As stated-above, according to the present invention, a specific region of the memory space is switched to the outer memory space only during test mode. It is not necessary to write the test instruction code or test data therein beforehand. There is the effect that modification of a test program or test data is implemented easily. It is not required to reserve an internal region for including the test instruction code or the test data. The amount of hardware can be reduced because it is not necessary to provide exclusive hardware resources for storing data and so forth. The test region does not occupy a part of the memory region, thus allowing an increase in the degree of freedom on the memory space. Since a part of space within the memory space is used as the test region, it is not necessary to output all bits of address data, thus allowing a reduction in the number of outer terminals.

While preferred embodiments of the invention have been described using specific terms, such description is for illustrative purposes only, and it is to be understood that changes and variations may be made without departing from the spirit or scope of the following claims.

What is claimed is:

1. A semi-conductor integrated circuit device using a single-chip semi-conductor comprising:

address decoding means for determining that a designated space is a test memory space;

means for rendering a decoding signal outputted from said address decoding means active when a test mode instruction signal denotes a test mode;

means for rendering a decoding signal outputted from said address decoding means inactive when a test mode instruction signal denotes a non-test mode; and means for allocating a memory region accessed by said semi-conductor integrated circuit device to a memory region external to said semi-conductor integrated circuit device when said decoding signal is active and when said address decoding means determines that the designated space is a test memory space.

2. A semi-conductor integrated-circuit device according to claim 1, wherein said means for allocating accesses a memory region internal to said semi-conductor integrated-circuit device when said decoding signal is not active or when said address decoding means does not determine that the designated space is a test memory space.

3. A semi-conductor integrated circuit device using single-chip semi-conductor comprising:

address decoding means for decoding that a designated space is test memory space;

means for rendering a decoding signal outputted from said address decoding means active when a test mode instruction signal denotes a test mode;

means for rendering a decoding signal outputted from said address decoding means inactive when a test mode instruction signal denotes a non-test mode; and means for allocating memory region accessed by said semi-conductor integrated circuit device to outer memory region of said semi-conductor integrated circuit device when said decoding signal is active, wherein said test memory space is brought into a part of memory space of said semi-conductor integrated circuit device, thus outputting an address data of an address width denoting inside of said test memory space.

4. A semi-conductor integrated circuit device using a single-chip semi-conductor comprising:

address decoding means for decoding that a designated space is test memory space;

means for rendering a decoding signal outputted from said address decoding means active when a test mode instruction signal denotes a test mode;

means for rendering a decoding signal outputted form said address decoding means inactive when a test mode instruction signal denotes a non-test mode; and means for allocating memory region accessed by said semi-conductor integrated circuit device to outer memory region of said semi-conductor integrated circuit device when said decoding signal is active, wherein internal resources are mapped to memory region corresponding to test memory space.

5. A semi-conductor integrated circuit device using single-chip semi-conductor comprising:

address decoding means for decoding that a designated space is test memory space;

means for rendering a decoding signal outputted from said address decoding means active when a test mode instruction signal denotes a test mode;

means for rendering a decoding signal outputted form said address decoding means inactive when a test mode instruction signal denotes a non-test mode; and means for allocating memory region accessed by said semi-conductor integrated circuit device to outer memory region of said semi-conductor integrated circuit device when said decoding signal is active, wherein when said semi-conductor integrated circuit device has outer memory region and outer terminals for accessing, said outer terminals are held in common as test terminals.

6. A semi-conductor integrated circuit device comprising:

address decoding means for decoding addresses of a memory region having a test memory space and a non-test memory space and for determining whether a respective address is an address of the test memory space, means for rendering a decoding signal outputted from said address decoding means active when a test mode instruction signal denotes a test mode;

means for rendering a decoding signal outputted from said address decoding means inactive when a test mode instruction signal denotes a non-test mode; and means for accessing a memory region external to said semi-conductor integrated circuit device when said decoding signal is active and when said address decoding means determines that the respective address is an address of the test memory space.

7. A test method of a semi-conductor integrated circuit device using single chip semi-conductor comprising the steps of:

determining whether or not a designated space is test memory space;

rendering a decoding signal outputted from said address decoding means inactive when a test mode instruction signal denotes a test mode;

rendering a decoding signal outputted from said address decoding means inactive when a test mode instruction signal denotes a non-test mode; and accessing a memory region external to said semi-conductor integrated circuit device when said decoding signal is active and when the designated space is determined to be a test memory space.

8. A test method of a semi-conductor integrated circuit device comprising the steps of:

decoding addresses of a memory region having a test memory space and a non-test memory space and determining whether a respective decoded address is an address of the test memory space, rendering a decoding signal outputted from said address decoding means inactive when a test mode instruction signal denotes a test mode;

rendering a decoding signal outputted from said address decoding means inactive when a test mode instruction signal denotes a non-test mode; and accessing a memory region external to said semi-conductor integrated circuit device when said decoding signal is active and when the designated space is determined to be a test memory space.

9. A semi-conductor integrated circuit device contained in a single semi-conductor chip, the device comprising:

active signal generating means for receiving an address signal and a test signal and outputting an active signal when both the address signal designates a test memory space and the test signal indicates a test mode; and means for accessing a memory region external to the semi-conductor integrated-circuit device when said active signal generating means outputs the active signal.

10. A semi-conductor integrated-circuit device according to claim 9, wherein said active signal generating means includes an address decoding means for determining whether or not the address signal designates the test memory space.

11. A semi-conductor integrated-circuit device according to claim 9, wherein the memory region external to the semi-conductor integrated-circuit is the test memory space.

12. A semi-conductor integrated-circuit device according to claim 11, further including a terminal for addressing the test memory space when said active signal generating means outputs the active signal.

* * * * *